United States Patent
Liu

(10) Patent No.: US 8,093,110 B2
(45) Date of Patent: Jan. 10, 2012

(54) METHOD FOR MANUFACTURING THIN FILM TRANSISTOR

(75) Inventor: Chang-Wei Liu, Hsin-Chu (TW)

(73) Assignee: AU Optronics Corp. (TW)

( * ) Notice: Subject to any disclaimer, the term of this patent is extended or adjusted under 35 U.S.C. 154(b) by 0 days.

(21) Appl. No.: 12/849,214

(22) Filed: Aug. 3, 2010

(65) Prior Publication Data

US 2010/0297817 A1    Nov. 25, 2010

Related U.S. Application Data

(62) Division of application No. 11/984,701, filed on Nov. 21, 2007, now Pat. No. 7,795,081.

(30) Foreign Application Priority Data

Dec. 29, 2006  (TW) ............................... 95149936 A

(51) Int. Cl.
*H01L 21/00*    (2006.01)
*H01L 21/337*    (2006.01)

(52) U.S. Cl. ........ 438/151; 438/149; 438/187; 438/195; 257/E21.028

(58) Field of Classification Search ................... 438/151, 438/149, 187; 257/E21.028
See application file for complete search history.

(56) References Cited

U.S. PATENT DOCUMENTS

| | | | |
|---|---|---|---|
| 5,656,824 A | 8/1997 | den Boer et al. | |
| 6,567,135 B1 | 5/2003 | Park | |
| 6,573,127 B2 | 6/2003 | Seo | |
| 2007/0218601 A1 | 9/2007 | Seo et al. | |
| 2009/0325331 A1 | 12/2009 | Yang et al. | |

FOREIGN PATENT DOCUMENTS

| | | |
|---|---|---|
| JP | 7-321326 | 12/1995 |
| JP | 8-213621 | 8/1996 |
| JP | 2006091823 | 4/2006 |
| KR | 1020060059579 A | 2/2006 |

*Primary Examiner* — Alexander Ghyka
*Assistant Examiner* — Seahvosh Nikmanesh
(74) *Attorney, Agent, or Firm* — Bacon & Thomas, PLLC

(57) ABSTRACT

A method for manufacturing a thin film transistor (TFT) is disclosed. The method is achieved by forming and defining a source and a drain of a thin film transistor through two lithographic processes cycles so that the channel length (L) of the thin film transistor can be reduced to 1.5 to 4.0 μm. Besides, the $I_{on}$ current of the thin film transistor is increased as the channel length (L) is decreased. Therefore, the component area of the thin film transistor is decreased as the channel width (W) is decreased. Thus, the aperture ratio of the TFT-LCD can be increased due to the decreased component area of the thin film transistor.

6 Claims, 11 Drawing Sheets

METHOD FOR MANUFACTURING THIN FILM TRANSISTOR

This application is a divisional of and claims the benefit of the earlier filing date of co-pending U.S. patent application Ser. No. 11/984,701 filed on Nov. 21, 2007, and parent claims priority under 35 U.S.C. 119 of Application No. 095149936, filed in Taiwan on Dec. 29, 2006. The entire co-pending application and TW 095149936 are herein incorporated by reference.

BACKGROUND OF THE INVENTION

1. Field of the Invention

The present invention relates to a method for manufacturing a thin film transistor and, more particularly, to a method for manufacturing a thin film transistor used for a large-sized display device.

2. Description of Related Art

Generally, a thin film transistor liquid crystal display device (TFT-LCD) mainly consists of a TFT array substrate, a color filter array substrate, and a liquid crystal (LC) layer, wherein the TFT array substrate includes plural pixel structures that consist of plural transistors in array arrangement and plural pixel electrodes. Each of the pixel electrodes corresponds to every transistor. The above-mentioned TFT mainly comprises a gate, a semiconductor layer, a source, a drain, and a channel. Mostly, the TFT is a switch component adopted for a liquid crystal display pixel unit.

Currently, the development object of LCDs tends toward a large size, high brightness, high contrast, a wide angle of view, and high color saturation. As larger and larger panels are manufactured, the current $I_{on}$ (i.e. the current as turning on the TFT) produced from every TFT is required to become higher and higher accordingly. In order to satisfy the requirement of the large-sized LCD panel, the direct way for promoting the current $I_{on}$ of the TFT is to increase the ratio (W/L) of the channel width (W) vs. the channel length (L).

However, the resolution of exposure equipment now in use is about 4 μm. After the subsequent etching processes are performed, the channel length (L) in the TFT becomes in the limit of about 4.5 μm to 5 μm. Therefore, the way now in use for promoting the current $I_{on}$ of the TFT can just be achieved by changing the channel width (W). For example, through designing U-type or double-U-type source/drain (S/D), the channel width (W) can be increased.

Nevertheless, if the source/drain (S/D) is designed in U-type or double-U-type, it still enlarges the area of the TFT component. Hence, the aperture ratio and the transmittance of the display device are both decreased, and the image quality of the display device is debased. Additionally, the desired pattern can not be obtained in the large-sized panel through being exposed by only one mask. In accordance with different process generations, the desired pattern generally is completed through three or several ten times exposure processes. Therefore, in order to avoid existence of heterogeneous images, the alignment of the exposure equipment is required to be extremely accurate. The aforementioned problems of the exposure processes in use have remained unsolved for some considerable time.

SUMMARY OF THE INVENTION

In the present invention, a source, a drain, and a channel therebetween are defined and formed through two lithographic process cycles. Therefore, the channel length (L) of the thin film transistor (TFT) can be reduced so as to increase the $I_{on}$ current of the TFT. Moreover, the component area of the TFT is relatively decreased as the channel width (W) is decreased. Thus, the aperture ratio of the TFT-LCD can be increased due to the decreased component area of the thin film transistor.

The present invention provides a method for manufacturing a thin film transistor (TFT). The method includes the following steps: (A) providing a substrate; (B) forming a patterned first metal layer, a patterned semiconductor layer, and a second metal layer on the substrate in sequence, wherein the patterned first metal layer comprises a gate; (C) forming a patterned first photoresist layer and a second photoresist layer respectively on the second metal layer, wherein part of the first photoresist layer is placed over one side of the first metal layer, and part of the second photoresist layer is placed over another side of the first metal layer in opposition to the side of the first metal layer; (D) removing part of the second metal layer, which is uncovered with the first photoresist layer and the second photoresist layer to form a patterned second metal layer; and (E) removing the first photoresist layer and the second photoresist layer to expose the patterned second metal layer to form a source and a drain.

Besides, the method for manufacturing a thin film transistor (TFT) in the present invention can selectively comprise the following steps, if necessary in manufacturing processes. The method for manufacturing a thin film transistor (TFT) in the present invention can selectively comprise: the step (F) forming a protective layer on the second metal layer; and the step (G) removing part of the protective layer to form a contact window to expose part of the patterned second metal layer. The protection layer can be made of any material. Preferably, it is made of silicon oxide, silicon nitride, or silicon hydroxide. In the method for manufacturing a thin film transistor (TFT) of the present invention, the step (B) can selectively further comprise: forming an insulation layer between the patterned first metal layer and the patterned semiconductor layer. Additionally, in the method for manufacturing a thin film transistor (TFT) of the present invention, the step (B) can selectively further comprise: forming an ohm contact layer between the patterned second metal layer and the patterned semiconductor layer. Besides, in the step (D), removing the ohm contact layer, which is uncovered with the first photoresist layer and the second photoresist layer, to form a patterned ohm contact layer.

In the method for manufacturing a thin film transistor (TFT) of the present invention, the first photoresist layer and the second photoresist layer can be patterned by any conventional method. Preferably, they are patterned by photolithography.

In the method for manufacturing a thin film transistor (TFT) of the present invention, the length of a channel of the patterned semiconductor layer is not limited. Preferably, it ranges about from 1.5 μm to 4.0 μm. More preferably, it ranges about from 1.5 μm to 2.5 μm.

In the method for manufacturing a thin film transistor (TFT) of the present invention, the material of the substrate can be any conventional material. Preferably, it is a glass substrate, a quartz substrate, or a plastic substrate.

In the method for manufacturing a thin film transistor (TFT) of the present invention, the material of the first metal layer can be any material. Preferably, it is Al, W, Cr, Cu, Ti, $TiN_x$, Al alloy, Cr alloy, Mo, or combination thereof.

In the method for manufacturing a thin film transistor (TFT) of the present invention, the material of the semiconductor layer can be any material. Preferably, it is amorphous silicon.

In the method for manufacturing a thin film transistor (TFT) of the present invention, the material of the second metal layer can be any material. Preferably, it is Al, W, Cr, Cu, Ti, TiN$_x$, Al alloy, Cr alloy, Mo, or combination thereof.

In the method for manufacturing a thin film transistor (TFT) of the present invention, the first photoresist layer can be positive photoresist, and the second photoresist layer can be negative photoresist.

In the method for manufacturing a thin film transistor (TFT) of the present invention, the first photoresist layer can be negative photoresist, and the second photoresist layer can be positive photoresist.

In the method for manufacturing a thin film transistor (TFT) of the present invention, the first photoresist layer can be negative photoresist, and the second photoresist layer can be negative photoresist.

In addition, the present invention also provides a method for manufacturing a thin film transistor (TFT). The method includes the following steps: (A) providing a substrate; (B) forming a patterned first metal layer, a semiconductor layer, and a second metal layer on the substrate in sequence, wherein the patterned first metal layer comprises a gate; (C) forming a patterned first photoresist layer on the second metal layer, wherein part of the first photoresist layer is placed over one side of the first metal layer; (D) forming a patterned second photoresist layer, on the second metal layer, wherein part of the second photoresist layer is placed over another side in opposition to the side of the first metal layer, and part of the second photoresist layer connecting to the first photoresist layer and covers on part of the first photoresist layer placed over the side of the first metal layer; (E) removing part of the second metal layer and the semiconductor layer, which are uncovered with the first photoresist layer and the second photoresist layer, to form a patterned second metal layer; (F) removing part of the first photoresist layer and part of the second photoresist layer to expose part of the patterned second metal layer; and (G) removing the exposed part of the patterned second metal layer, remaining part of the first photoresist layer, and remaining part of the second photoresist layer to expose the patterned second metal layer to form a source and a drain.

Similarly, the method for manufacturing a thin film transistor (TFT) in the present invention can selectively comprise the following steps, if necessary in manufacturing processes. The method for manufacturing a thin film transistor (TFT) in the present invention can selectively comprise: the step (H) forming a protective layer on the patterned second metal layer; and the step (I) removing part of the protective layer to form a contact window to expose par of the patterned second metal layer. The protection layer can be made of any material. Preferably, it is made of silicon oxide, silicon nitride, or silicon hydroxide.

In the method for manufacturing a thin film transistor (TFT) of the present invention, the step (A) can selectively further comprise: forming an insulation layer between the patterned first metal layer and the patterned semiconductor layer. The material of the insulation layer is not limited. Preferably, it is silicon oxide, silicon nitride, or silicon hydroxide.

In the method for manufacturing a thin film transistor (TFT) of the present invention, the step (A) can selectively further comprise: forming an ohm contact layer between the second metal layer and the semiconductor layer. Besides, the step (E) and the step (G) further comprise: removing part of the ohm contact layer, which is uncovered with the first photoresist layer and the second photoresist layer, to form a patterned ohm contact layer.

In the method for manufacturing a thin film transistor (TFT) of the present invention, the first photoresist layer in the step (C) can be patterned by any conventional method. Preferably, it is patterned by photolithography. The second photoresist layer can be patterned by any conventional method. Preferably, it is patterned by photolithography collocated with half-tone masks.

In the method for manufacturing a thin film transistor (TFT) of the present invention, the length of a channel of the patterned semiconductor layer is not limited. Preferably, it ranges about from 1.5 µm to 4.0 µm. More preferably, it ranges about from 1.5 µm to 2.5 µm.

In the method for manufacturing a thin film transistor (TFT) of the present invention, the material of the substrate can be any conventional material. Preferably, it is a glass substrate, a quartz substrate, or a plastic substrate.

In the method for manufacturing a thin film transistor (TFT) of the present invention, the material of the first metal layer can be any material. Preferably, it is Al, W, Cr, Cu, Ti, TiN$_x$, Al alloy, Cr alloy, Mo, or combination thereof.

In the method for manufacturing a thin film transistor (TFT) of the present invention, the material of the semiconductor layer can be any material. Preferably, it is amorphous silicon.

In the method for manufacturing a thin film transistor (TFT) of the present invention, the material of the second metal layer can be any material. Preferably, it is Al, W, Cr, Cu, Ti, TiN$_x$, Al alloy, Cr alloy, Mo, or combination thereof.

In the method for manufacturing a thin film transistor (TFT) of the present invention, the first photoresist layer can be positive photoresist, and the second photoresist layer can be negative photoresist.

In the method for manufacturing a thin film transistor (TFT) of the present invention, the first photoresist layer can be negative photoresist, and the second photoresist layer can be positive photoresist.

In the method for manufacturing a thin film transistor (TFT) of the present invention, the first photoresist layer can be negative photoresist, and the second photoresist layer can be negative photoresist.

Further, the present invention provides a method for manufacturing a thin film transistor (TFT). The method includes the following steps: (A) providing a substrate; (B) forming a patterned first metal layer, a patterned semiconductor layer, and a second metal layer on the substrate in sequence, wherein the patterned first metal layer comprises a gate; (C) forming a patterned first photoresist layer on the second metal layer, wherein part of the first photoresist layer is placed over one side of the first metal layer; (D) removing part of the second metal layer uncovered with the first photoresist layer to form a source; (E) forming a transparent conductive layer on the substrate, the second metal layer, and the first photoresist layer; (F) forming a patterned second photoresist layer on the transparent conductive layer, wherein the patterned second photoresist layer and the source is not overlapped; and (G) removing part of the transparent conductive layer uncovered with the patterned second photoresist layer to form a pixel electrode.

The method for manufacturing a thin film transistor (TFT) in the present invention can selectively comprise: the step (H) removing the patterned first photoresist layer and the patterned second photoresist layer; and forming a protective layer on the patterned second metal layer.

The method for manufacturing a thin film transistor (TFT) of the present invention can selectively further comprise: forming an insulation layer between the patterned first metal layer and the patterned semiconductor layer.

In the method for manufacturing a thin film transistor (TFT) of the present invention, the length of a channel of the patterned semiconductor layer is not limited. Preferably, it ranges about from 1.5 μm to 4.0 μm. More preferably, it ranges about from 1.5 μm to 2.5 μm.

In the method for manufacturing a thin film transistor (TFT) of the present invention, the patterned first photoresist layer can be positive photoresist, and the patterned second photoresist layer can be positive photoresist.

The source and the drain (S/D) are defined through the above-mentioned three methods which are exposure-twice methods. Due to the accurate alignment of exposure equipment, the channel length (L) of the S/D can be decreased from 4 μm to 2 μm, even to 1.5 μm. Therefore, the components of the TFT can be in smaller sizes, and the aperture ratio thereof can be increased. Thus, even though the components of the TFT are smaller in size, the same current $I_{on}$ can still be achieved.

In other words, for the purpose of decreasing the channel length (L) of the TFT, exposure-twice methods are utilized to define the source and the drain. Because of the decreased channel length (L), the current $I_{on}$ is increased. Thus, the channel width (W) is decreased. When the channel width (W) is decreased, the area of the TFT component can be diminished so as to increase the aperture ratio.

Besides, the method for manufacturing a thin film transistor (TFT) of the present invention can also be applied to design the S/D of the TFT in U-type or double-U-type.

Moreover, the present invention further provides a thin film transistor substrate used for liquid crystal display devices, which includes a base; and a plurality of thin film transistors disposed on the base. At least one thin film transistor has a gate layer, a source/drain layer, and a semiconductor layer, having a channel length of about 1.5 μm to 4.0 μm.

In order to provide a complete thin film transistor substrate for the liquid crystal display devices, the substrate of the present invention can further comprise a plurality of signal lines and a plurality of scan lines. Every signal line and every scan line can be interlaced together, but not conducted together. In every TFT of the present invention, the gate layer can be conducted with a scan line, and the source can be conducted with a signal line.

Compared with the conventional TFT structure, a smaller channel between the source and the drain of the TFT in the substrate of the present invention can be obtained. Therefore, the length channel (L) of the TFT can be decreased. Besides, the lower substrate used for the liquid crystal display device in the present invention can not only obtain the increased current $I_{on}$, but also have the decreased component area of the TFT. Thus, the aperture ratio of the TFT can be raised.

Other objects, advantages, and novel features of the invention will become more apparent from the following detailed description when taken in conjunction with the accompanying drawings.

DETAILED DESCRIPTION OF THE PREFERRED EMBODIMENT

In the present embodiments, the source and the drain are respectively defined in the TFT by exposure-twice. Because the alignment accuracy of exposure equipment can reach to the limit of about 1 μm, which is better than the exposure resolution (about 3 μm to 4 μm) thereof, the channel length (L) of the TFT can be diminished from 4 μm to 2 μm, even to 1.5 μm.

Embodiment 1

With reference to FIGS. 2a to 2h, there is shown a flowchart in a perspective view of the method in Embodiment 1 of the present invention.

Figure 2A:
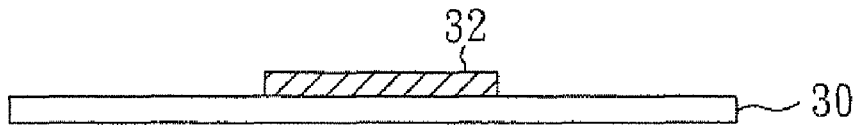
FIGS. 2a to 2h show a flowchart in a perspective view of the method in one embodiment of the present invention.

As shown in FIG. 2a, first, a substrate 30 is provided. The substrate 30 can be a glass substrate, a quartz substrate, or a plastic substrate. Subsequently, in a step of forming a first pattern, a patterned first metal layer 32, as a gate of the TFT, is formed on the substrate 30. The first metal layer can be made of Al, W, Cr, Cu, Ti, $TiN_x$, Al alloy, Cr alloy, or Mo, and it can be a single-layered structure, or a multiple-layered structure.

Figure 2B:
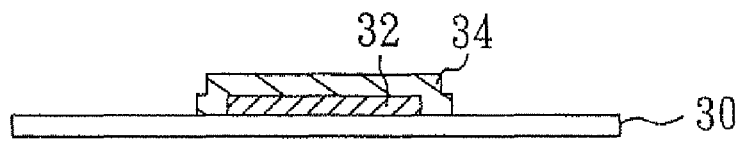

As shown in FIG. 2b, a step of forming a second pattern is performed. A patterned semiconductor layer 34 is formed on the patterned first metal layer 32, especially covering the patterned first metal layer 32 for example. The patterned semiconductor layer 34 can be made of amorphous silicon (α-Si).

Figure 2C:
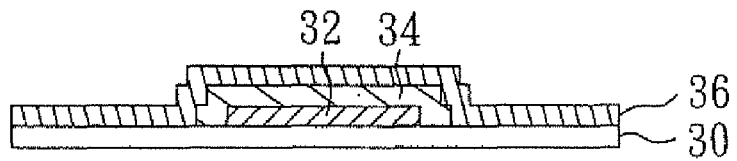

As shown in FIG. 2c, a second metal layer 36 is formed on the patterned semiconductor layer 34. The second metal layer 36 can be made of Al, W, Cr, Cu, Ti, $TiN_x$, Al alloy, Cr alloy, or Mo, and it can be a single-layered structure, or a multiple-layered structure. The second metal layer 36 can be formed through chemical or physical vapor deposition processes.

Figure 2D:
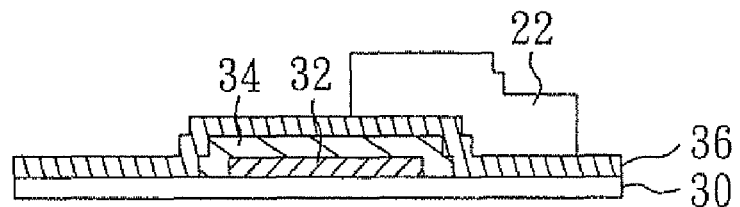

Next, a step of forming a third pattern is performed. As shown in FIG. 2d, a first photoresist layer 22 is defined and formed on the second metal layer 36 by a first mask (not shown in FIG. 2d) through photolithography.

In order to prevent the bonding structure of the patterned first photoresist layer 22 from being destroyed by subsequent photolithography, the first photoresist layer 22 is baked to fix the bonding structure thereof before a step of forming a fourth pattern, and after the step of forming the third pattern in the present embodiment. In the present embodiment, the hard baking process is performed. Certainly, the baking processes applied in the present invention are not limited to the method performed in the present embodiment.

Figure 2E:
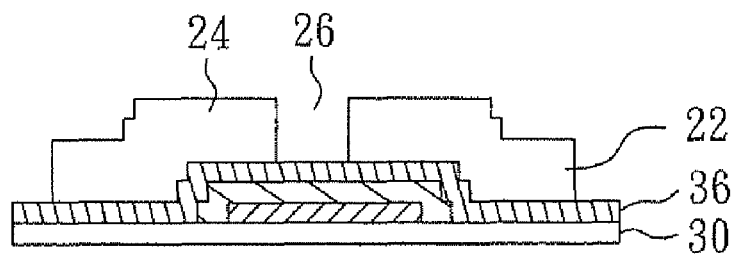

Then, a step of forming a fourth pattern is performed. As shown in FIG. 2e, a second photoresist layer is deposited on the second metal layer 36. A patterned second photoresist layer 24 is defined and formed by a second mask (not shown in FIG. 2e) through photolithography. Therefore, part of the second metal layer 36 on the patterned first metal layer 32 is exposed. Because part of the first photoresist layer 22 is placed over one side of the first metal layer 32, and part of the first photoresist layer 24 is placed over another side in opposition to the side of the first metal layer 32, a channel 26 over the first metal layer 32 is formed between the first photoresist layer 22 and the second photoresist layer 24. As the alignment accuracy of exposure equipment now in use reaches about 1

μm, the length ($L_{PR}$) of the channel 26 between the first photoresist layer 22 and the second photoresist layer 24 is about 1.5 to 2.5 μm.

Figure 2F:
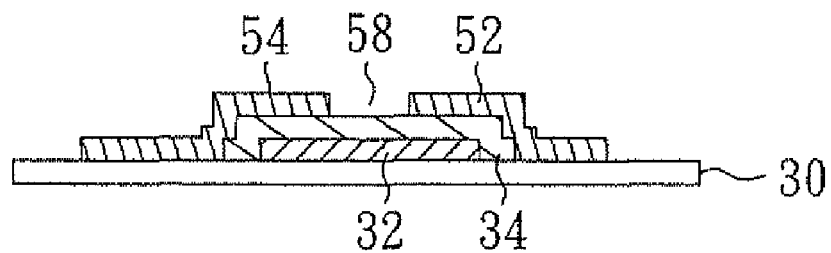

Subsequently, the TFT is etched to remove the second metal layer 36 uncovered with the first photoresist layer 22 and the second photoresist layer 24. The first photoresist layer 22 and the second photoresist layer 24 are removed. As shown in FIG. 2f, the second metal layer 36 covered with the first photoresist layer 22 and the second photoresist layer 24 is obtained, and then a source 52, a drain 54, and other components (i.e. a data line, a drain contact area, and so forth) are formed. Besides, the second metal layer 36 between the source 52 and the drain 54 is also removed, and a channel 58 is formed. The channel 58 is similar to the channel 26 so that the length the channel 58 can reach to about 1.5 to 2.5 μm. In the present embodiment, the channel 26 between the first photoresist layer 22 and the second photoresist layer 24 is 1.5 μm. In addition, the position of the source 52 corresponds to part of the first photoresist layer 22, and the position of the drain 54 corresponds to part of the second photoresist layer 24.

Figure 2G:
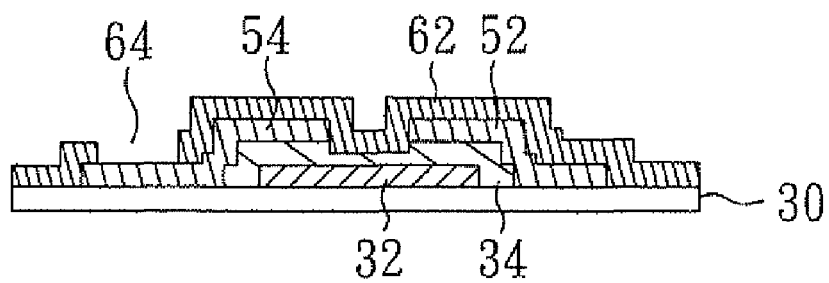

Successively, a step of forming a fifth pattern is performed. As shown in FIG. 2g, a patterned protection layer 62 is formed on the substrate 30. Additionally, the protective layer on a contact area is removed to expose the second metal layer 36, and then a contact window 64 is formed.

Figure 2H:
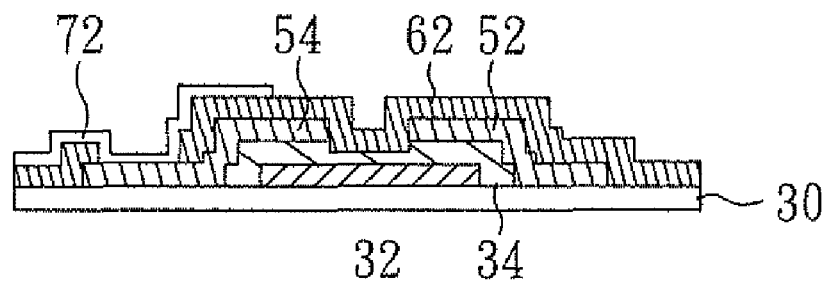

Finally, a step of forming a sixth pattern is performed. As shown in FIG. 2h, a patterned transparent conductive layer 72 is formed on the protection layer 62. The transparent conductive layer 72 is a pixel electrode of LCDs. Moreover, the transparent conductive layer 72 conducts to the TFT by way of the contact window 64.

In the present embodiment, the first photoresist layer and the second photoresist layer on the second metal layer are defined respectively through the first mask and the second mask. In other words, through the two-mask process, the photoresist patterns of the source and the drain are defined. As the alignment accuracy of exposure equipment is better than the exposure accuracy, the channel between the first photoresist layer and the second photoresist layer can be shortened, so as to reduce the channel length (L) of the TFT. Furthermore, due to the reduced channel length (L), the current $I_{on}$ is increased. Accordingly, the channel width (W) is also decreased to result in a diminished component area, and a higher aperture ratio.

Hence, in the present invention, the source and the drain are defined through two-masks processes for the purpose of reducing the channel length (L) of the TFT to even under the limit of the exposure accuracy of exposure equipment. The current $I_{on}$ is increased for the above reason, and then the channel width (W) of the TFT is relatively decreased to result in a diminished component area, and a higher aperture ratio.

Embodiment 2

With reference to FIG. 3a to FIG. 3h, there is shown a flowchart in a perspective view of the method in Embodiment 2 of the present invention. The processes in the present embodiment basically are similar to those in aforementioned Embodiment 1, and the differences therebetween are illustrated hereinafter.

Figure 3A:
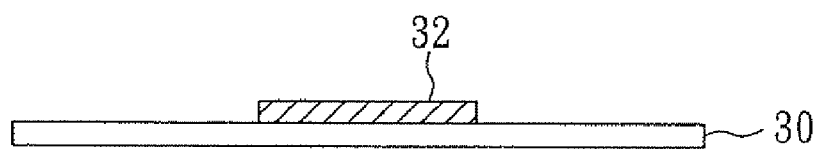
FIGS. 3a to 3h show a flowchart in a perspective view of the method in another embodiment of the present invention.

As shown in FIG. 3a, first, a substrate 30 is provided. The substrate 30 can be a glass substrate, a quartz substrate, or a plastic substrate. Subsequently, in a step of forming a first pattern, a patterned first metal layer 32, as a gate of the TFT, is formed on the substrate 30. The first metal layer can be made of Al, W, Cr, Cu, Ti, $TiN_x$, Al alloy, Cr alloy, or Mo, and it can be a single-layered structure, or a multiple-layered structure.

Figure 3B:
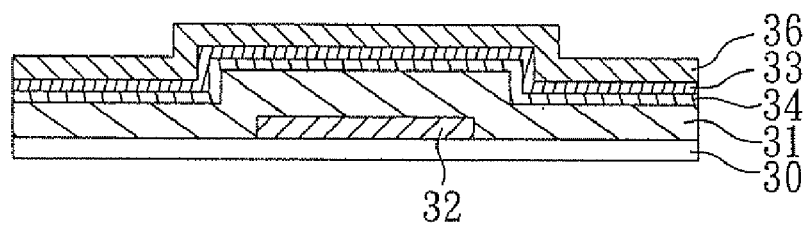

As shown in FIG. 3b, an insulation layer 31, a semiconductor layer 34, an ohm contact layer 33, and a second metal layer 36 are formed in sequence on the patterned first metal layer 32. The insulation layer 31 can be made of $SiO_x$, $SiN_y$, or silicon oxynitirde. The patterned semiconductor layer 34 can be made of amorphous silicon (α-Si). The ohm contact layer 33 can be made of a doped semiconductor, i.e. n-type doped silicon ($n^+$-Si). The second metal layer 36 can be made of Al, W, Cr, Cu, Ti, $TiN_x$, Al alloy, Cr alloy, or Mo, and it can be a single-layered structure, or a multiple-layered structure. The ways for forming the above layers in sequence can be chemical or physical vapor deposition processes.

Figure 3C:
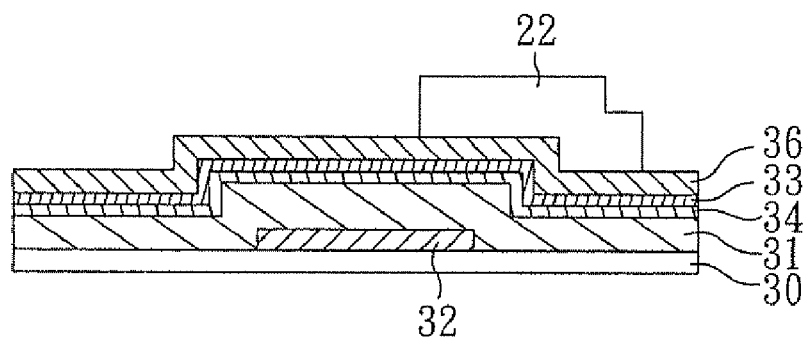

As shown in FIG. 3c, a step of forming a second pattern is performed by a second mask (not shown in FIG. 3c). A patterned first photoresist layer 22 is formed on the second metal layer 36.

Figure 3D:
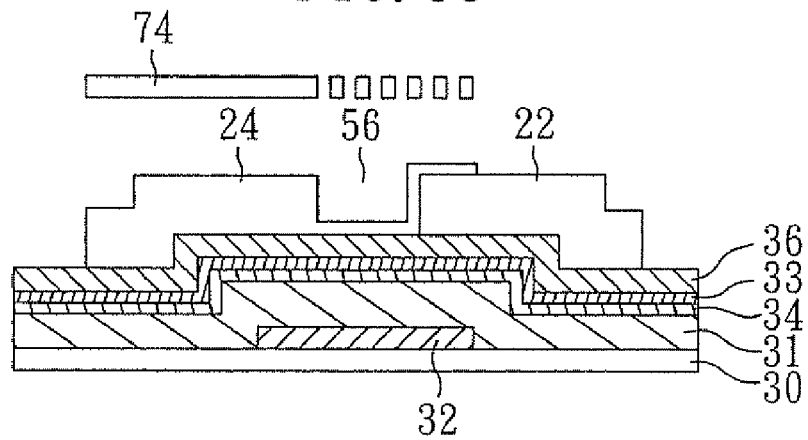

As shown in FIG. 3d, a step of forming a third pattern is performed by a fourth half-tone mask 74. A patterned second photoresist layer 24 with two different kinds of thickness is formed on the second metal layer 36. Part of the first photoresist layer 22 is deposited over one side of the first metal layer 32, and part of the second photoresist layer 24 is deposited over another side in opposition to the side of the first metal layer 32. The part with the less thickness of the second photoresist layer 24 covers on the first photoresist layer 22. Besides, the second photoresist layer 24 has a gap 56 formed over the second metal layer.

As the alignment accuracy of exposure equipment now in use reaches to about 1 μm, the length of the gap 56 can be formed about 1.5 to 2.5 μm through exposure twice.

Figure 3E:
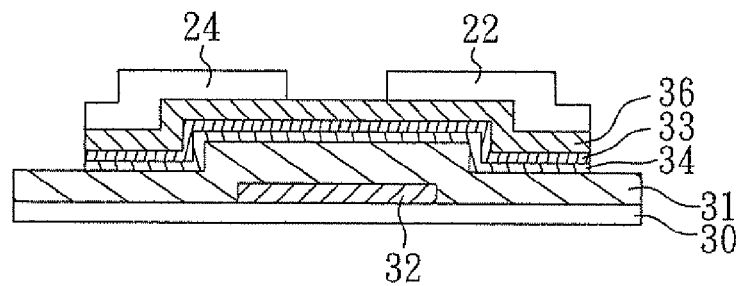

As shown in FIG. 3e, the second metal layer 36, the ohm contact layer 33, and the semiconductor layer 34, which are uncovered with the first photoresist layer 22 and the second photoresist layer 24, are removed first. Subsequently, part of the first photoresist layer 22, and part of the second photoresist layer 24 are removed to expose part of the second metal layer 36.

Figure 3F:
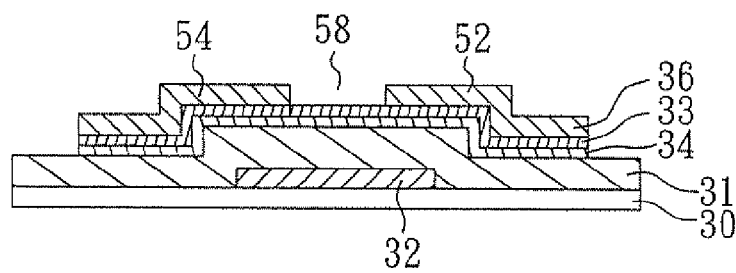

As shown in FIG. 3f, the exposed part of the second metal layer 36, part of the ohm contact layer 33, and part of the semiconductor layer 34 are removed in sequence. Next, the residual first photoresist layer 22 and the residual second photoresist layer 24 are removed to expose the second metal layer 36, and then a source 52 and a drain 54 are formed, Through exposure twice to define the source and the drain, the channel length (L) of the TFT can reach to about 1.5 to 2.5 μm.

Figure 3G:
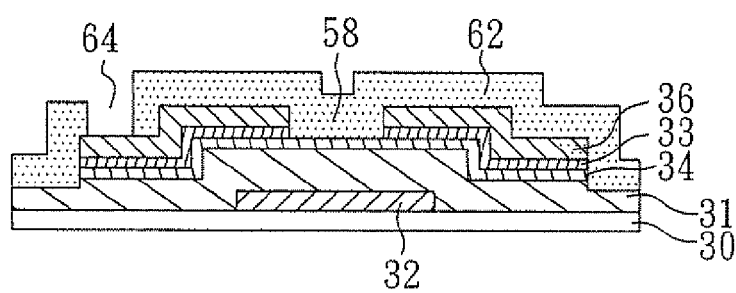

Successively, a step of forming a fourth pattern is performed. As shown in FIG. 3g, a patterned protection layer 62 is formed on the second metal layer 36. Additionally, part of the protective layer 62 is removed to expose the second metal layer 36, and then a contact window 64 is formed.

Figure 3H:
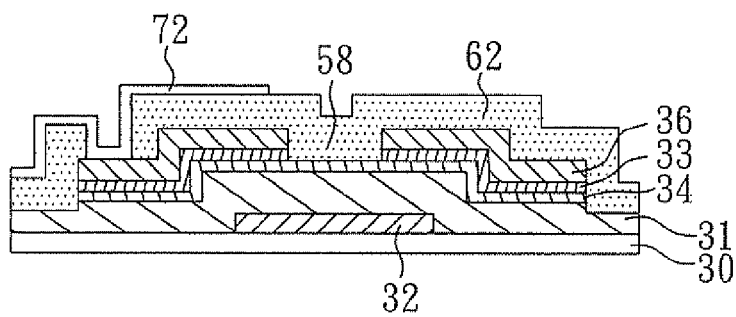

Finally, a step of forming a fifth pattern is performed. As shown in FIG. 3h, a patterned transparent conductive layer 72 is formed on the protection layer 62. The transparent conductive layer 72 is a pixel electrode of LCDs. Moreover, the transparent conductive layer 72 conducts to the TFT by way of the contact window 64.

In the present embodiment, the first photoresist layer and the second photoresist layer on the second metal layer are defined respectively through the third mask and the fourth half-tone mask. In other words, through the two-masks process, the photoresist patterns of the source and the drain are defined. As the alignment accuracy of exposure equipment is better than the exposure accuracy, the width of the gap between the first photoresist layer and the second photoresist layer can be shortened, so as to reduce the channel length (L) of the TFT, to even under the limit of the exposure accuracy of exposure equipment. Furthermore, due to the reduced channel length (L), the current $I_{on}$ is increased. Accordingly, the channel width (W) is also decreased to result in a diminished component area, and a higher aperture ratio.

Embodiment 3

With reference to FIG. 4a to FIG. 4i, there is shown a flowchart in a perspective view of the method in Embodiment 3 of the present invention. The processes in the present embodiment basically are similar to those in aforementioned Embodiment 1, and the differences therebetween are illustrated hereinafter.

Figure 4A:
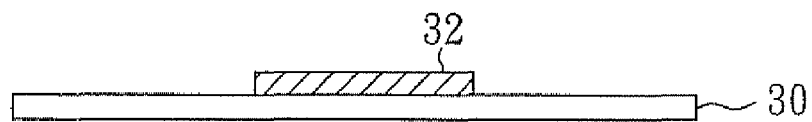
FIGS. 4a to 4i show a flowchart in a perspective view of the method in another embodiment of the present invention.

As shown in FIG. 4a, first, a substrate 30 is provided. The substrate 30 can be a glass substrate, a quartz substrate, or a plastic substrate. Subsequently, in a step of forming a first pattern, a patterned first metal layer 32, as a gate of the TFT, is formed on the substrate 30. The first metal layer can be made of Al, W, Cr, Cu, Ti, $TiN_x$, Al alloy, Cr alloy, or Mo, and it can be a single-layered structure, or a multiple-layered structure.

Figure 4B:
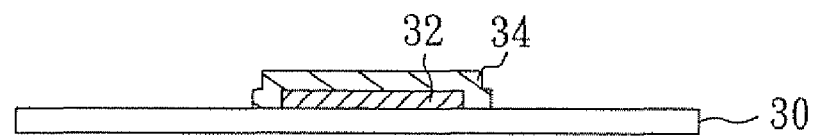

As shown in FIG. 4b, a step of forming a second pattern is performed. A patterned semiconductor layer 34 is formed on the patterned first metal layer 32. The patterned semiconductor layer 34 can be made of amorphous silicon (α-Si).

Figure 4C:
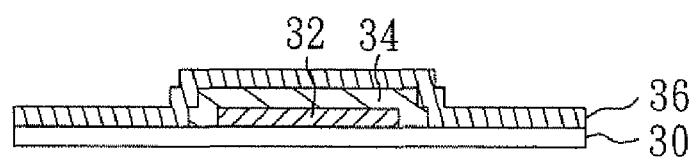

As shown in FIG. 4c, a second metal layer 36 is formed on the patterned semiconductor layer 34. The second metal layer 36 can be made of Al, W, Cr, Cu, Ti, $TiN_x$, Al alloy, Cr alloy, or Mo, and it can be a single-layered structure, or a multiple-layered structure. The second metal layer 36 can be formed through chemical or physical vapor deposition processes.

Figure 4D:
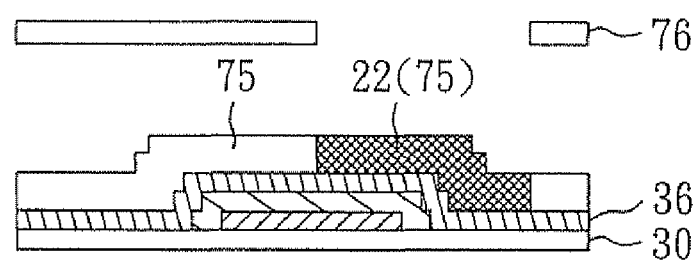

Next, a step of forming a third pattern is performed. As shown in FIG. 4d, a negative photoresist layer 75 is formed totally on the second metal layer 36, and then the negative photoresist layer 75 is exposed by a first mask 76. Part of the negative photoresist layer 75 is hardened, and the hardened part thereof serves as a first photoresist layer 22.

Figure 4E:
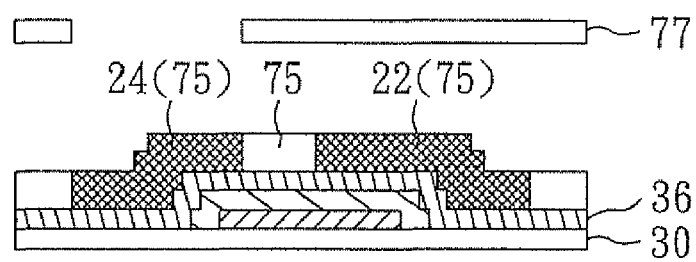
Figure 4F:
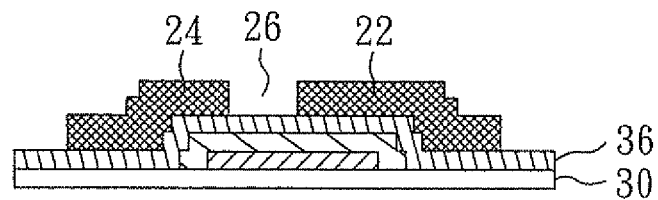

Then, a step of forming a fourth pattern is performed. As shown in FIG. 4e, part of the negative photoresist layer 75, which is still not hardened and shown in FIG. 4d, is exposed by a second mask 77 with a pattern different from the pattern of the first mask 76. The hardened part of the negative photoresist layer 75 exposed by the second mask 77 serves as a second photoresist layer 24. Subsequently, the negative photoresist layer 75 is developed to remove the non-hardened part of the negative photoresist layer 75, as the structure shown in FIG. 4f. Because part of the first photoresist layer 22 is placed over one side of the first metal layer 32, and part of the first photoresist layer 24 is placed over another side in opposition to the side of the first metal layer 32, a channel 26 over the first metal layer 32 is formed between the first photoresist layer 22 and the second photoresist layer 24. As the alignment accuracy of exposure equipment now in use reaches to about 1 μm, the length ($L_{PR}$) of the channel 26 between the first photoresist layer 22 and the second photoresist layer 24 can reach to about 1.5 to 2.5 μm.

Besides, in the present embodiment, the first photoresist layer 22 and the second photoresist layer 24 both are made of negative photoresist. In other words, a photoresist layer, i.e. the negative photoresist layer 75, is formed first. Then, it is patterned through being exposed by different masks in sequence so as to form the first photoresist layer 22 and the second photoresist layer 24. Additionally, the first photoresist layer 22 and the second photoresist layer 24 are not formed in specific sequence. Therefore, the present embodiment has advances in less photoresist consumption and fewer manufacturing processes than in Embodiment 1.

Figure 4G:
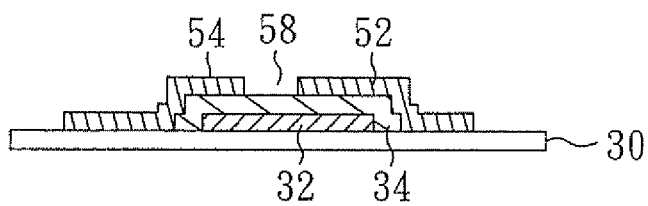

Subsequently, the TFT is etched to remove the second metal layer 36 uncovered with the first photoresist layer 22 and the second photoresist layer 24. The first photoresist layer 22 and the second photoresist layer 24 are removed. As shown in FIG. 4g, the second metal layer 36 uncovered with the first photoresist layer 22 and the second photoresist layer 24 is removed, and then a source 52, a drain 54, and other components (i.e. a data line, a drain contact area, and so forth) are formed. Besides, the second metal layer 36 between the source 52 and the drain 54 is also removed, and a channel 58 is formed. The channel 58 is similar to the channel 26 so that the length of the channel 58 can reach to about 1.5 to 2.5 μm. In the present embodiment, the channel 26 between the first photoresist layer 22 and the second photoresist layer 24 is about 1.5 μm. In addition, the position of the source 52 corresponds to part of the first photoresist layer 22, and the position of the drain 54 corresponds to part of the second photoresist layer 24.

Figure 4H:
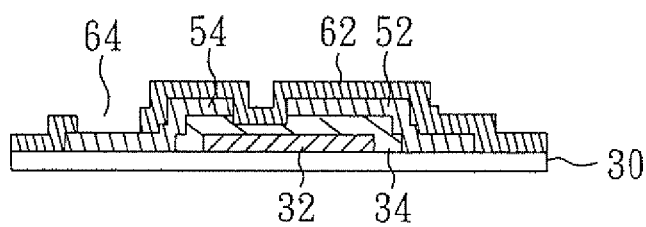

Successively, a step of forming a fifth pattern is performed. As shown in FIG. 4h, forming a fifth pattern is performed. A patterned protection layer 62 is formed on the substrate 30. Additionally, the protective layer 62 on a contact area is removed to expose the second metal layer 36, and then a contact window 64 is formed.

Figure 4I:
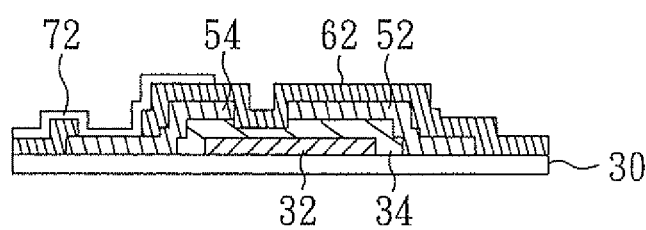

Finally, a step of forming a sixth pattern is performed. As shown in FIG. 4i, a patterned transparent conductive layer 72 is formed on the protection layer 62. The transparent conductive layer 72 is a pixel electrode of LCDs. Moreover, the transparent conductive layer 72 conducts to the TFT by way of the contact window 64.

In the present embodiment, the first photoresist layer and the second photoresist layer on the second metal layer are defined respectively through the first mask and the second mask. In other words, through the two-mask process, the source and the drain are defined. Hence, in the present invention, the source and the drain are defined through two-masks processes for the purpose of reducing the channel length (L) of the TFT to even under the limit of the exposure accuracy of exposure equipment. The current $I_{on}$ is increased for the above reason, and then the channel width (W) of the TFT is relatively decreased to result in a diminished component area, and a higher aperture ratio.

Embodiment 4

With reference to FIG. 5a to FIG. 5j, there is shown a flowchart in a perspective view of the method in Embodiment 4 of the present invention. The processes in the present embodiment basically are similar to those in aforementioned Embodiment 1, and the differences therebetween are illustrated hereinafter.

Figure 5A:
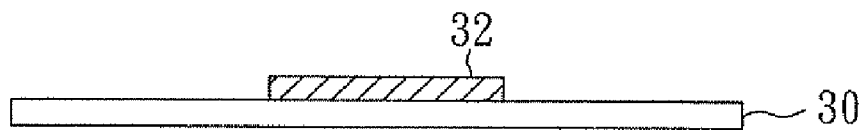
FIGS. 5a to 5j show a flowchart in a perspective view of the method in another embodiment of the present invention.

As shown in FIG. 5a, first, a substrate 30 is provided. The substrate 30 can be a glass substrate, a quartz substrate, or a plastic substrate. Subsequently, in a step of forming a first pattern, a patterned first metal layer 32, as a gate of the TFT, is formed on the substrate 30. The first metal layer 32 can be made of Al, W, Cr, Cu, Ti, $TiN_x$, Al alloy, Cr alloy, or Mo, and it can be a single-layered structure, or a multiple-layered structure.

Figure 5B:
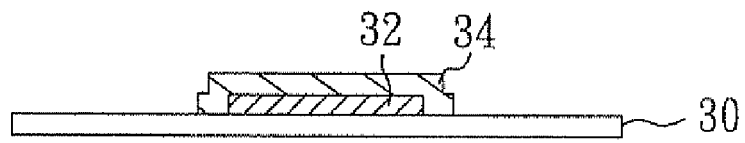

As shown in FIG. 5b, a step of forming a second pattern is performed. A patterned semiconductor layer 34 is formed on the patterned first metal layer 32. The patterned semiconductor layer 34 can be made of amorphous silicon (α-Si).

Figure 5C:
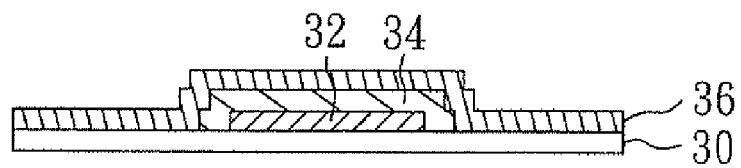

As shown in FIG. 5c, a second metal layer 36 is formed on the patterned semiconductor layer 34. The second metal layer 36 can be made of Al, W, Cr, Cu, Ti, $TiN_x$, Al alloy, Cr alloy, or Mo, and it can be a single-layered structure, or a multiple-layered structure. The second metal layer 36 can be formed through chemical or physical vapor deposition processes.

Figure 5D:
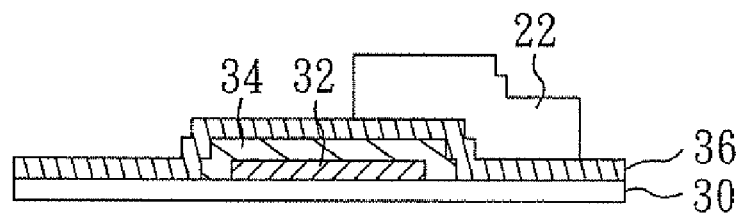

Next, a step of forming a third pattern is performed. As shown in FIG. 5d, a first photoresist layer 22 is defined and formed on the second metal layer 36 by a first mask (not shown in FIG. 5d) through photolithography.

In order to prevent the bonding structure of the patterned first photoresist layer 22 from being destroyed by subsequent photolithography, the first photoresist layer 22 is baked to fix the bonding structure thereof before the step of forming a fourth pattern, and after the step of forming the third pattern in the present embodiment. In the present embodiment, the hard baking process is performed. Certainly, the baking processes applied in the present invention are not limited to the method performed in the present embodiment.

Figure 5E:
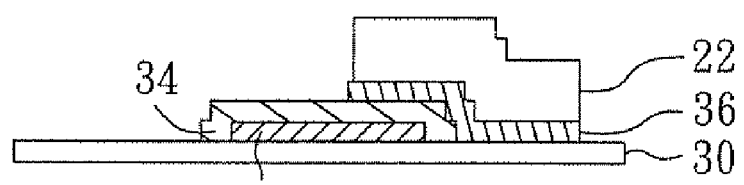
Figure 5F:
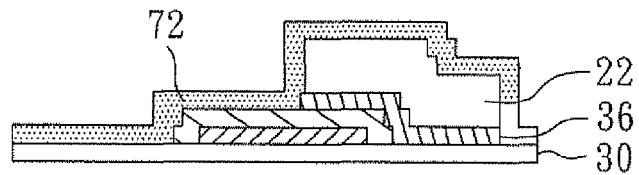
Figure 5G:
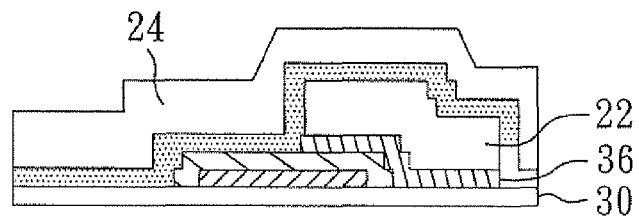
Figure 5H:
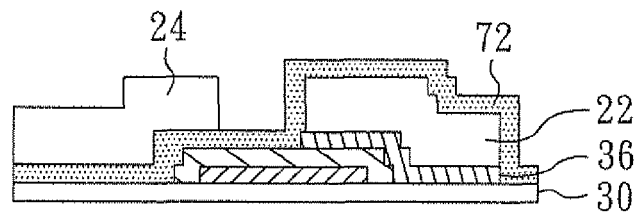

After completing the above steps, as shown in FIG. 5e, the second metal layer 36 uncovered with the first photoresist layer 22 is removed to expose parts of the substrate 30 and the second metal layer 36. Subsequently, as shown in FIG. 5f, the substrate 30 is totally coated with a transparent conductive layer 72. Moreover, as shown in FIG. 5g, a second photoresist layer 24 is formed on the transparent conductive layer 72, and then is patterned by photolithography (i.e. a step of forming a fourth pattern). As shown in FIG. 5h, after the second photoresist layer 24 is patterned, part of the second photoresist layer 24 is placed over one side of the first metal layer 32. In the present embodiment, the first photoresist layer 22 and the second photoresist layer 24 both are made of positive photoresist.

Figure 5I:
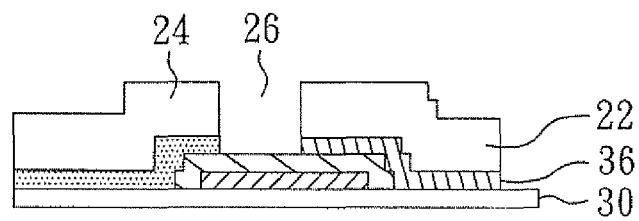

Additionally, as shown in FIG. 5i, the transparent conductive layer 72 uncovered with the second photoresist layer 24 is removed. At this moment, a hole 26 over the first metal layer 32 is formed between the first photoresist layer 22 and the second photoresist layer 24. As the alignment accuracy of exposure equipment now in use reaches to about 1 µm, the length ($L_{PR}$) of the channel 26 between the first photoresist layer 22 and the second photoresist layer 24 can reach to about 1.5 to 2.5 µm.

Figure 5J:
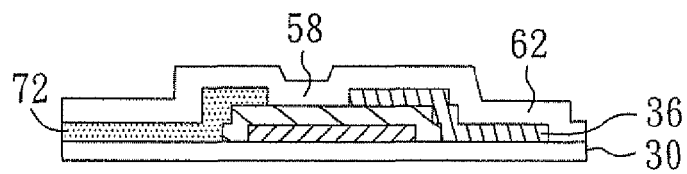

Finally, as shown in FIG. 5j, the first photoresist layer 22 and the second photoresist layer 24 are removed. The second metal layer 36 and the transparent conductive layer 72, both covered with the first photoresist layer 22 and the second photoresist layer 24, are maintained to form a source 52, a drain 54, a pixel electrode (not shown in FIG. 5j), and other components. A channel 58 between the source 52 and the drain 54 is similar to the channel 26 between the photoresist layers so that the length of the channel 58 can reach to about 1.5~2.5 µm. In the present embodiment, the channel 26 between the first photoresist layer 22 and the second photoresist layer 24 is 1.5 µm. The source 52 corresponds to part of the first photoresist layer 22, and the drain 54 and the pixel electrode correspond to part of the second photoresist layer 24. Then, the source 52, the drain 54, and the pixel electrode are formed.

Furthermore, a protective layer 62 is formed over the substrate 30 (as shown in FIG. 5j). The protective layer 62 is exposed, developed, and etched to form a conduction contact hole (not shown in FIG. 5j) in the position of the electrode.

As shown in FIG. 5a-5j, a gate insulation layer (not shown) may be formed between the patterned first metal layer 32 and patterned semiconductor layer 34.

Comparative Example

With reference to FIG. 1a to FIG. 1g, there is shown a flowchart in a perspective view of the method in a present comparative example of the present invention. As the alignment accuracy of exposure equipment is in limit to 4 µm, the channel length (L) of the conventional TFT can only reach a minimum between 4.5 µm and 5 µm after etching processes. The present comparative example is illustrated in detail as the following steps.

Figure 1A:
FIGS. 1a to 1g show a flowchart in a perspective view of the method in a comparative example of the present invention.
Figure 1B:
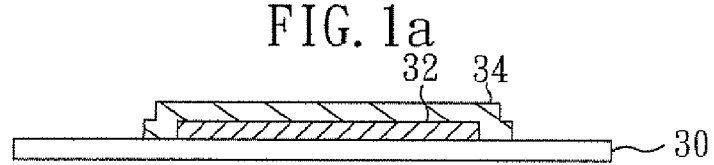
Figure 1C:
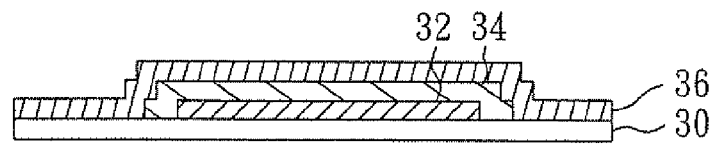

As shown in FIG. 1a, first, a substrate 30 is provided. Subsequently, in a step of forming a first pattern, a patterned first metal layer 32, as a gate of the TFT, is formed on the substrate 30. Then, as shown in FIG. 1b, a step of forming a second pattern is performed. A patterned semiconductor layer 34, such as amorphous silicon, is formed on the first metal layer 32. Moreover, as shown in FIG. 1c, a second metal layer 36 is formed on the patterned semiconductor layer 34.

Figure 1D:
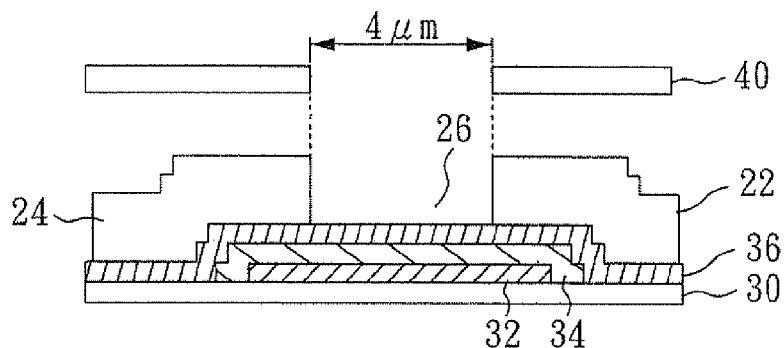

As shown in FIG. 1d, in a step of forming a third pattern, a patterned first photoresist layer 22 and a patterned second photoresist layer 24 are formed by one mask on the second metal layer 36. Because the alignment accuracy of a mask 40 of exposure equipment can be controlled to about 4 µm (i.e. the limit of the alignment accuracy of exposure equipment now in use), the channel 26 length (L) of the present comparative example can only reach a minimum between 4.5 µm and 5 µm.

Figure 1E:
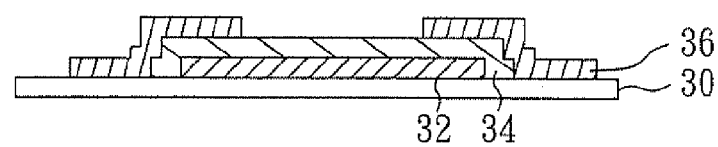

Next, as shown in FIG. 1e, the second metal layer 36 is exposed through etching. Then, the first photoresist layer 22 and the second photoresist layer 24 are removed, and a source and a drain are formed.

Figure 1F:
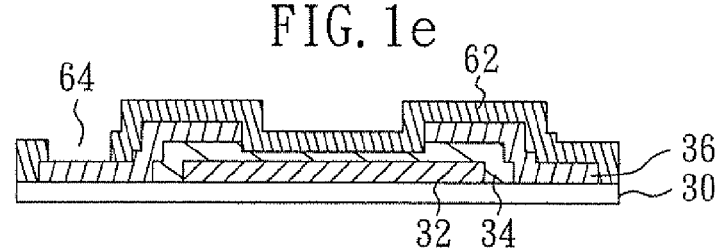

Subsequently, a step of forming a fourth pattern is performed. As shown in FIG. 1f, a patterned protection layer 62 is formed on the second metal layer 36. Additionally, part of the protective layer is removed to expose part of the second metal layer 36, and then a contact window 64 is formed.

Figure 1G:
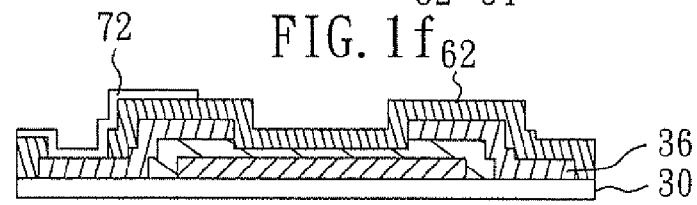

Finally, a step of forming a fifth pattern is performed. As shown in FIG. 1g, a patterned transparent conductive layer 72 is formed on the protection layer 62. The transparent conductive layer 72 is a pixel electrode of LCDs. Moreover, the transparent conductive layer 72 conducts to the TFT by way of the contact window 64.

Figure 6:
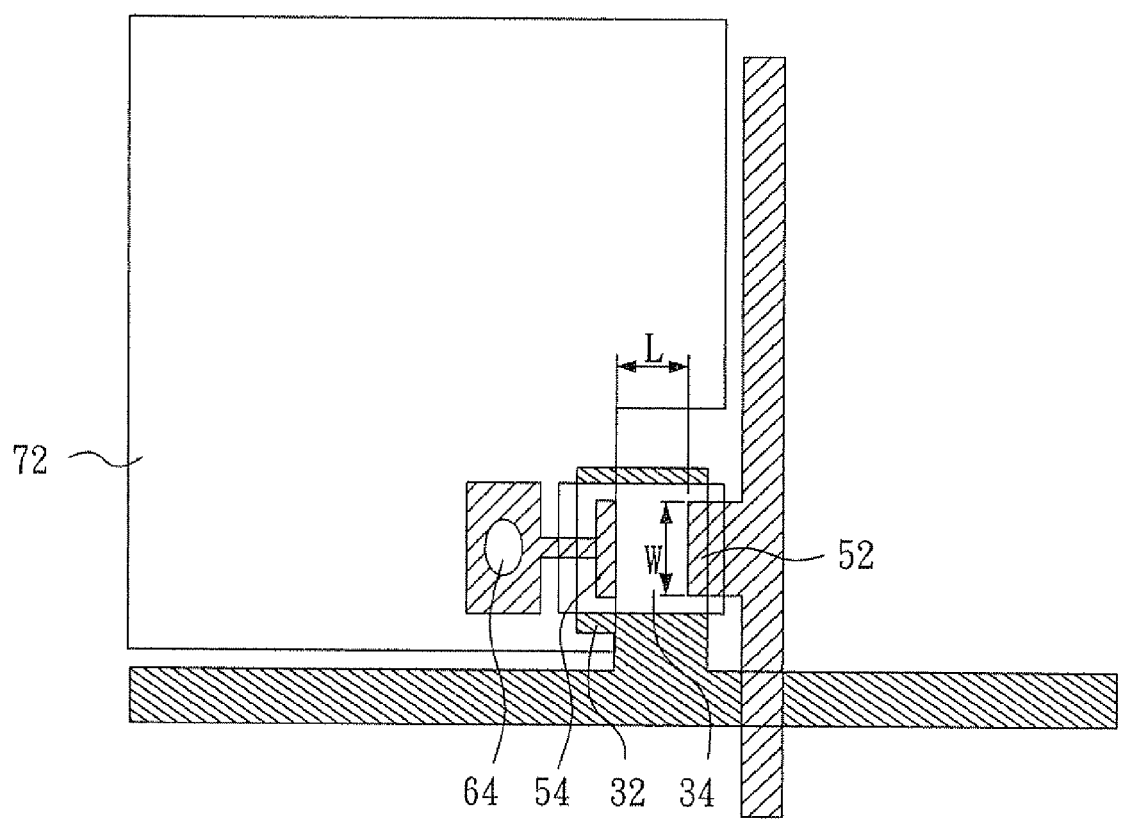
FIG. 6 is a top view of the method shown in FIG. 1g.
Figure 7:
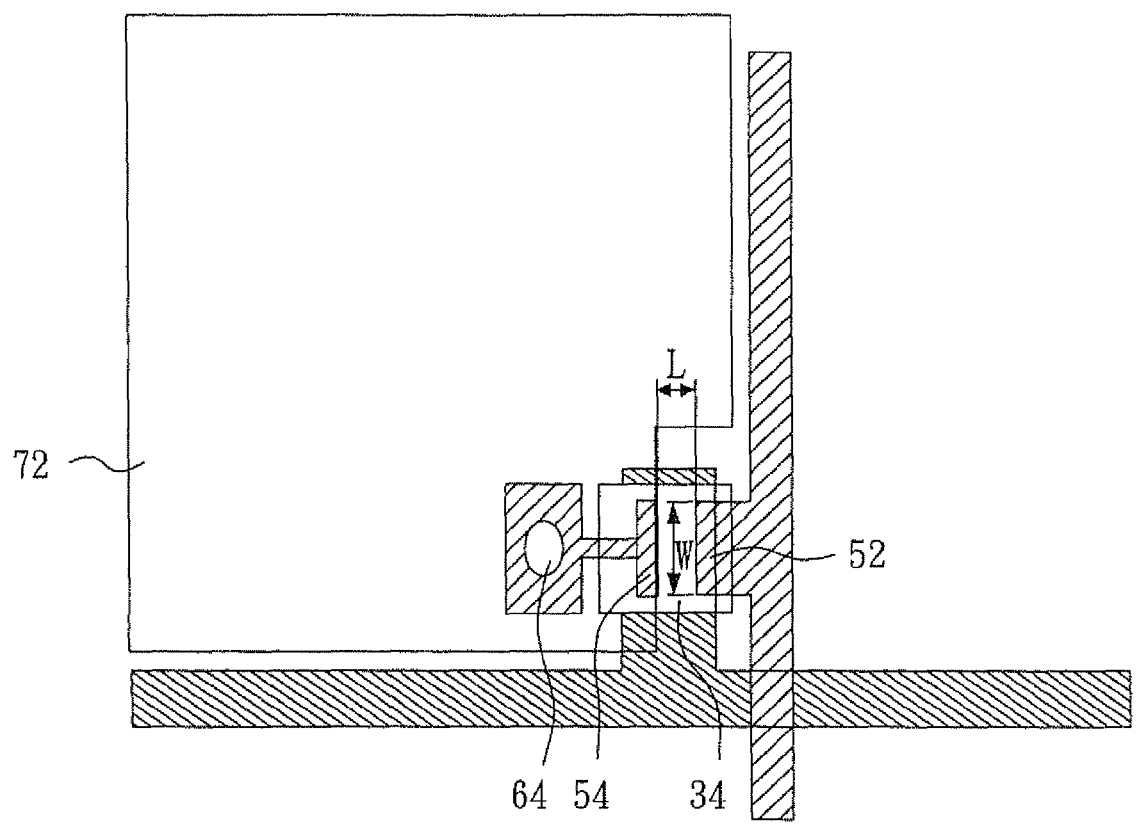
FIG. 7 is a top view of the method shown in FIG. 2h.

FIG. 6 and FIG. 7 respectively are top views of FIG. 1g and FIG. 2h. As comparing FIG. 6 with FIG. 7, the aperture ratio in FIG. 6 is smaller than that in FIG. 7. Besides, it also can be observed that the aperture ratio apparently is increased as the length (L) of the channel 26 is reduced. Under the same current Ion, the channel length (L) can be diminished in the present invention, so as to reduce the component area of the TFT. Therefore, in display devices, the aperture ratio and the transmittance can both be promoted so that the image quality can be improved. Additionally, in the present invention, due to the reduced channel length (L), the current $I_{on}$ of the TFT is increased, and there is no effect on the aperture. Accordingly, in the present invention, under the unchanged light source of exposure or the unchanged mask, the line width or the channel width can be reduced to even less than the limit of the exposure accuracy of exposure equipment. Then, the aperture ratio of the display device can be promoted.

Although the present invention has been explained in relation to its preferred embodiment, it is to be understood that many other possible modifications and variations can be made without departing from the scope of the invention as hereinafter claimed.

What is claimed is:

1. A method for manufacturing a thin film transistor (TFT), comprising:

providing a substrate;

forming a patterned first metal layer, a patterned semiconductor layer, and a second metal layer on the substrate in sequence, wherein the patterned first metal layer comprises a gate;

forming a patterned first photoresist layer on the second metal layer, wherein part of the patterned first photoresist layer is placed over one side of the first metal layer;

removing part of the second metal layer uncovered with the first photoresist layer to form a source;

forming a transparent conductive layer on the substrate, the second metal layer, and the first photoresist layer;

forming a patterned second photoresist layer on the transparent conductive layer, wherein the patterned second photoresist layer and the source is not overlapped; and removing part of the transparent conductive layer uncovered with the patterned second photoresist layer to form a pixel electrode;

wherein the step of forming the patterned first photoresist layer and the step of forming the patterned second photoresist layer are not performed simultaneously.

2. The method as claimed in claim 1, further comprising:
removing the patterned first photoresist layer and the patterned second photoresist layer; and
forming a protective layer on the patterned second metal layer.

3. The method as claimed in claim 1, further comprising:
forming an insulation layer between the patterned first metal layer and the patterned semiconductor layer.

4. The method as claimed in claim 1, wherein the length of a channel of the patterned semiconductor layer is about 1.5 μm to about 4.0 μm.

5. The method as claimed in claim 1, wherein the length of a channel of the patterned semiconductor layer is about 1.5 μm to about 2.5 μm.

6. The method as claimed in claim 1, wherein the pattern first photoresist layer and the pattern second photoresist layer are positive photoresist.

* * * * *